(12) United States Patent
Okumura et al.

(10) Patent No.: US 11,387,326 B2
(45) Date of Patent: Jul. 12, 2022

(54) SILICON CARBIDE SEMICONDUCTOR DEVICE AND METHOD FOR MANUFACTURING THE SAME

(71) Applicant: DENSO CORPORATION, Kariya (JP)

(72) Inventors: Kentarou Okumura, Kariya (JP); Hidekazu Odake, Kariya (JP); Hajime Tsukahara, Toyota (JP); Yukihiko Watanabe, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/065,062

(22) Filed: Oct. 7, 2020

(65) Prior Publication Data

US 2021/0111251 A1   Apr. 15, 2021

(30) Foreign Application Priority Data

Oct. 11, 2019 (JP) .............................. JP2019-187806

(51) Int. Cl.
*H01L 29/16* (2006.01)
*H01L 29/66* (2006.01)
*H01L 29/78* (2006.01)

(52) U.S. Cl.
CPC .... *H01L 29/1608* (2013.01); *H01L 29/66712* (2013.01); *H01L 29/7802* (2013.01)

(58) Field of Classification Search
CPC ................. H01L 21/0485; H01L 29/45; H01L 29/66712; H01L 29/7802; H01L 29/66068; H01L 29/1608
See application file for complete search history.

(56) References Cited

U.S. PATENT DOCUMENTS

| 10,403,497 | B2* | 9/2019 | Fukuda | .................. H01L 29/872 |
| 2011/0092063 | A1* | 4/2011 | Kawai | .................. H01L 21/0485 |
| | | | | 438/602 |
| 2016/0056041 | A1* | 2/2016 | Tamaso | ............... H01L 29/1608 |
| | | | | 438/602 |
| 2018/0174840 | A1* | 6/2018 | Joshi | .................. H01L 29/42304 |
| 2018/0323261 | A1* | 11/2018 | Kawai | ................... H01L 29/456 |
| 2020/0152594 | A1* | 5/2020 | Utsumi | ............... H01L 29/1608 |

FOREIGN PATENT DOCUMENTS

| JP | 2001-068428 A | 3/2001 |
| JP | 2004-014709 A | 1/2004 |

* cited by examiner

*Primary Examiner* — Bilkis Jahan
*Assistant Examiner* — Victor V Barzykin
(74) *Attorney, Agent, or Firm* — Posz Law Group, PLC (57) ABSTRACT

A silicon carbide semiconductor device includes: a silicon carbide semiconductor substrate that has a front surface and a rear surface; and a plurality of ohmic electrodes that are in ohmic contact with a surface of silicon carbide on at least one of the front surface and the rear surface of the silicon carbide semiconductor substrate. The plurality of ohmic electrodes are scattered on the surface of the silicon carbide to provide a concavity and convexity. The concavity and convexity has a height due to the ohmic electrodes less than 1.0 μm.

17 Claims, 6 Drawing Sheets

SILICON CARBIDE SEMICONDUCTOR DEVICE AND METHOD FOR MANUFACTURING THE SAME

CROSS REFERENCE TO RELATED APPLICATION

The present application claims the benefit of priority from Japanese Patent Application No. 2019-187806 filed on Oct. 11, 2019. The entire disclosure of the above application is incorporated herein by reference.

TECHNICAL FIELD

The present disclosure relates to relates to a silicon carbide (hereinafter referred to as SiC) semiconductor device capable of reducing a contact resistance of an ohmic electrode included in a semiconductor element made of SiC and a method for manufacturing the SiC semiconductor device.

BACKGROUND

When forming a semiconductor element such as a vertical power device using a SiC substrate, an ohmic electrode having reduced contact resistance is used for an electrode for connecting the device to an electric circuit or the like. Particularly, the ohmic electrode is used for a drain electrode on a rear surface of the substrate.

SUMMARY

A silicon carbide semiconductor device includes: a silicon carbide semiconductor substrate that has a front surface and a rear surface; and a plurality of ohmic electrodes that are in ohmic contact with a surface of silicon carbide on at least one of the front surface and the rear surface of the silicon carbide semiconductor substrate. The plurality of ohmic electrodes are scattered on the surface of the silicon carbide to provide a concavity and convexity. The concavity and convexity has a height due to the ohmic electrodes less than 1.0 μm.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Ohmic contact in SiC requires the formation of an alloy layer between SiC and a metal, for example, metal silicide or metal carbide. Specifically, high temperature treatment is essential for its formation. For example, when nickel silicide (NiSi) is formed, high temperature treatment at 900° C. or higher is required.

In the case of a SiC semiconductor device, the back surface electrode is formed after forming the device structure on the front surface side. When the entire wafer on which the device structure is formed is processed by the high temperature treatment in a high temperature furnace or the like, the front surface side device structure and characteristics are affected. Thus, local heating of the back electrode by a laser is performed. An ohmic electrode is provided by forming NiSi with this local heating with a laser, for example, in a conceivable method.

However, when the alloy layer is formed by local heating with a laser, the alloy layer is locally formed. Further, the SiC substrate is damaged, and a part of the SiC substrate is evaporated. For this reason, unevenness is formed on the SiC substrate after the laser processing, and stress concentrates due to the unevenness, so that the element strength is reduced and the reliability is reduced.

In view of the above points, in the present embodiments, a SiC semiconductor device is provided such that the device has an excellent ohmic characteristics and suppresses a decrease in element strength to improve reliability, and a method for manufacturing the same is provided.

In order to achieve the above object, the SiC semiconductor device according to the present disclosure includes: a SiC semiconductor substrate having a front surface and a back surface; and an ohmic electrode on at least one of a front surface side and a back surface side of the SiC semiconductor substrate. The ohmic electrode is in ohmic contact with a part of one surface of SiC, and is scattered (i.e., dotted) on the one surface of SiC to have unevenness, and the height of unevenness due to the ohmic electrode is less than 1.0 μm.

Thus, the height of the irregularities of the ohmic electrode from the boundary between the one surface of SiC and the ohmic electrode is less than 1.0 μm. Therefore, the bending strength is 1000 MPa or more, and it is possible to suppress the decrease in the element strength and to provide a SiC semiconductor device with improved reliability.

The method for manufacturing a SiC semiconductor device according to the present disclosure includes: forming a metal thin film on SiC for ohmic contact and made of a metal material that provides at least one of silicide and carbide; and forming an ohmic electrode by irradiating a laser beam on the metal thin film to perform a laser annealing for reacting the metal thin film with Si or C in SiC and for forming at least one of metal silicide and metal carbide. The laser annealing is performed using a top-hat type laser.

As described above, since the laser annealing is performed by the top-hat type laser, the laser intensity at the time of laser annealing is suppressed from being equal to or higher than the energy for sublimation of SiC, and the unevenness of the SiC surface is minimized. Therefore, the surface of the SiC becomes substantially flat, and the height of the irregularities of the ohmic electrode from the boundary between the one surface of the SiC and the ohmic electrode is less than 1.0 µm. Therefore, it is possible to manufacture a SiC semiconductor device having a bending strength of 1000 MPa or more.

The reference numerals in parentheses attached to the components and the like indicate an example of correspondence between the components and the like and specific components and the like in an embodiment to be described below.

Hereinafter, embodiments of the present disclosure will be described with reference to the drawings. In the following embodiments, the same reference numerals are assigned to portions that are the same or equivalent to each other for description.

First Embodiment

Hereinafter, a first embodiment of the present disclosure will be described. A SiC semiconductor device according to the present embodiment will be described with reference to FIG. 1. In the present embodiment, a SiC semiconductor device having a planar vertical power MOSFET as a SiC semiconductor element will be described. For example, the present SiC semiconductor device may be applied to an inverter.

Figure 1:
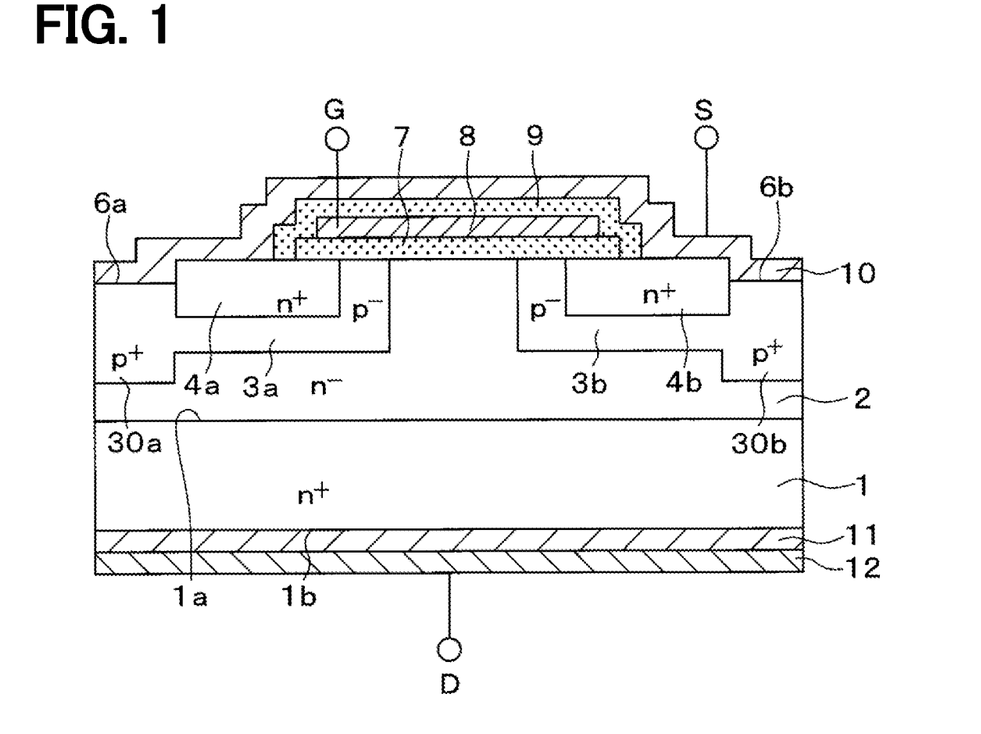
FIG. 1 is a cross-sectional view of an SiC semiconductor device according to a first embodiment.

The vertical power MOSFET includes an $n^+$ type SiC substrate 1. The $n^+$ type SiC substrate 1 has an upper surface as a main front surface 1a and a lower surface opposite to the main front surface 1a as a rear surface 1b. The $n^+$ type SiC substrate 1 is made of single crystal SiC. For example, the $n^+$ type SiC substrate 1 has an impurity concentration of $1 \times 10^{18}$ cm$^{-3}$ or more.

Above the main front surface 1a of the $n^+$ type SiC substrate 1, an $n^-$ type epitaxial layer 2 is stacked. The $n^-$ type epitaxial layer 2 is made of SiC having a lower dopant concentration than the $n^+$ type SiC substrate 1.

In a predetermined region of a surface layer portion of the $n^-$ type epitaxial layer 2, $p^-$ type base regions 3a and 3b each having a predetermined depth are formed to be spaced apart from each other. Further, the $p^-$ type base regions 3a and 3b are provided with deep base layers 30a and 30b each having a part with a thickness greater than the $p^-$ type base regions 3a and 3b. That is, each of the deep base layers 30a and 30b corresponds to a thicker part of the $p^-$ type base regions 3a and 3b. The deep base layers 30a and 30b are formed in portions which do not overlap $n^+$ type source regions 4a and 4b, which will be described later. The thicker portions of the $p^-$ type base regions 3a and 3b, where the deep base layers 30a and 30b are formed, have impurity concentrations greater than thinner portions where the deep base layers 30a and 30b are not formed. By forming such deep base layers 30a and 30b, electric field intensity between the $n^+$ type SiC substrate 1 and the deep base layers 30a and 30b are increased, and avalanche breakdown is likely to occur in these portions.

In a predetermined region of a surface layer portion of the $p^-$ type base region 3a, an $n^+$ type source region 4a shallower than the $p^-$ type base region 3a is formed. In a predetermined region of a surface layer portion of the $p^-$ type base region 3b, an $n^+$ type source region 4b shallower than the $p^-$ type base region 3b is formed.

Recesses 6a and 6b are formed in the surface portions of the $p^-$ type base regions 3a, 3b and the $n^+$ type source regions 4a, 4b. The deep base layers 30a, 30b having higher p type impurity concentration are exposed from bottoms of the recesses 6a and 6b.

Further, the surface portions of the $p^-$ type base regions 3a and 3b between the $n^-$ type epitaxial layer 2 and the $n^+$ type source region 4a and between the n– type epitaxial layer 2 and the $n^+$ type source region 4b are used as channel regions, and a gate insulation film 7 made of, for example, a silicon oxide film is formed at least on the channel region. The gate insulation film 7 is formed on the upper surfaces of the $n^-$ type epitaxial layer 2 and the $n^+$ type source regions 4a and 4b including the channel region. Further, a gate electrode 8 is formed on the gate insulation film 7, and the gate electrode 8 is covered with an insulation film 9 made of a silicon oxide film or the like.

On the front surface 1a side of the $n^+$ type SiC substrate 1, a source electrode 10 is formed to cover an upper surface of the insulation film 9, and is connected to the $n^+$ type source regions 4a, 4b and the $p^-$ type base regions 3a, 3b.

On the rear surface 1b of the $n^+$ type SiC substrate 1, a drain electrode 11 is formed. The drain electrode 11 is an ohmic electrode and is in ohmic contact with the back surface 1b of the $n^+$ type SiC substrate 1 by performing the laser anneal process to form an alloy layer of at least one of metal silicide and metal carbide on the back surface 1b. Therefore, the drain electrode 11 is made of a material that reacts with SiC to form at least one of metal silicide and metal carbide. Further, the surface of the drain electrode 11 is covered with the bonding electrode 12, and the metal plate or the circuit board (not shown) can be electrically connected through the bonding electrode 12.

For example, as a metal forming the drain electrode 11, nickel (Ni), molybdenum (Mo), titanium (Ti), tungsten (W), niobium (Nb), tantalum (Ta), or the like may be used. Ni, Mo, and Ti react with Si to form a silicide, and Mo and Ti combine with C to form a carbide. W and Nb combine with C to form carbide. The metal for forming the drain electrode 11 may be one or more kinds of materials, and may be a composite material obtained by combining a plurality of the materials mentioned here, for example, Mo/Ni. Further, the material for forming the drain electrode 11 may include impurities.

The metal for forming the bonding electrode 12 may be any material suitable for bonding such as soldering, and for example, Ti/Ni/Au may be used.

Figure 2:
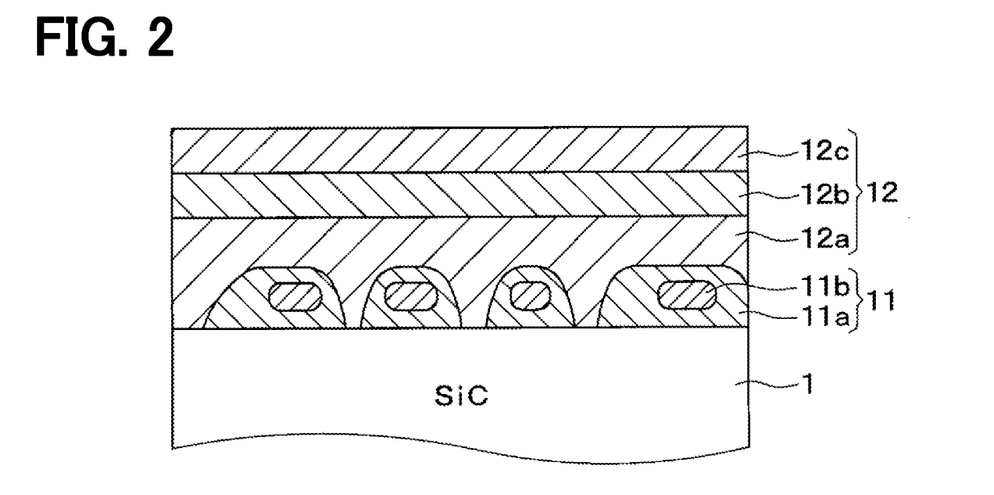
FIG. 2 is an enlarged view of an interface between SiC and a drain electrode or the like for providing an ohmic electrode in the SiC semiconductor device shown in FIG. 1.

FIG. 2 schematically shows the state of the interface with SiC when Mo/Ni is used as the drain electrode 11 and Ti/Ni/Au is used as the bonding electrode. As shown in this drawing, Ni reacts with Si to form NiSi 11a, and Mo reacts with C to form MoC 11b inside thereof. Then, these are in a scattered state, a Ti layer 12a is formed so as to cover the NiSi 11a and the MoC 11b that provide the scattered drain electrode 11, and a Ni layer 12b and an Au layer 12c are further formed thereon to stack on the Ti layer 12a. Although the case where Ni and Mo included in the drain electrode 11 all react with SiC to provide NiSi 11a and MoC 11b is described here, at least a part of Ni and Mo may become silicide and carbide.

Here, as described above, the drain electrode 11 is an ohmic electrode by forming an alloy layer made of metal silicide or metal carbide by the laser annealing. Alternatively, as shown in FIG. 2, the alloy layer may be locally formed, or the n+ type SiC substrate 1 may be damaged and a part thereof may be eliminated. As a result, unevenness, i.e., a concavity and convexity, due to the drain electrode 11 is formed on the n+ type SiC substrate 1 after the laser processing, and the stress is concentrated by the unevenness, so that the element strength may be reduced and the reliability may be reduced.

Therefore, in the present embodiment, the unevenness height H1 of the drain electrode 11 from the surface of the back surface 1b of the n+ type SiC substrate 1 shown in FIG. 1, that is, the interface between the back surface 1b and the drain electrode 11 is less than 1.0 μm.

Figure 3:
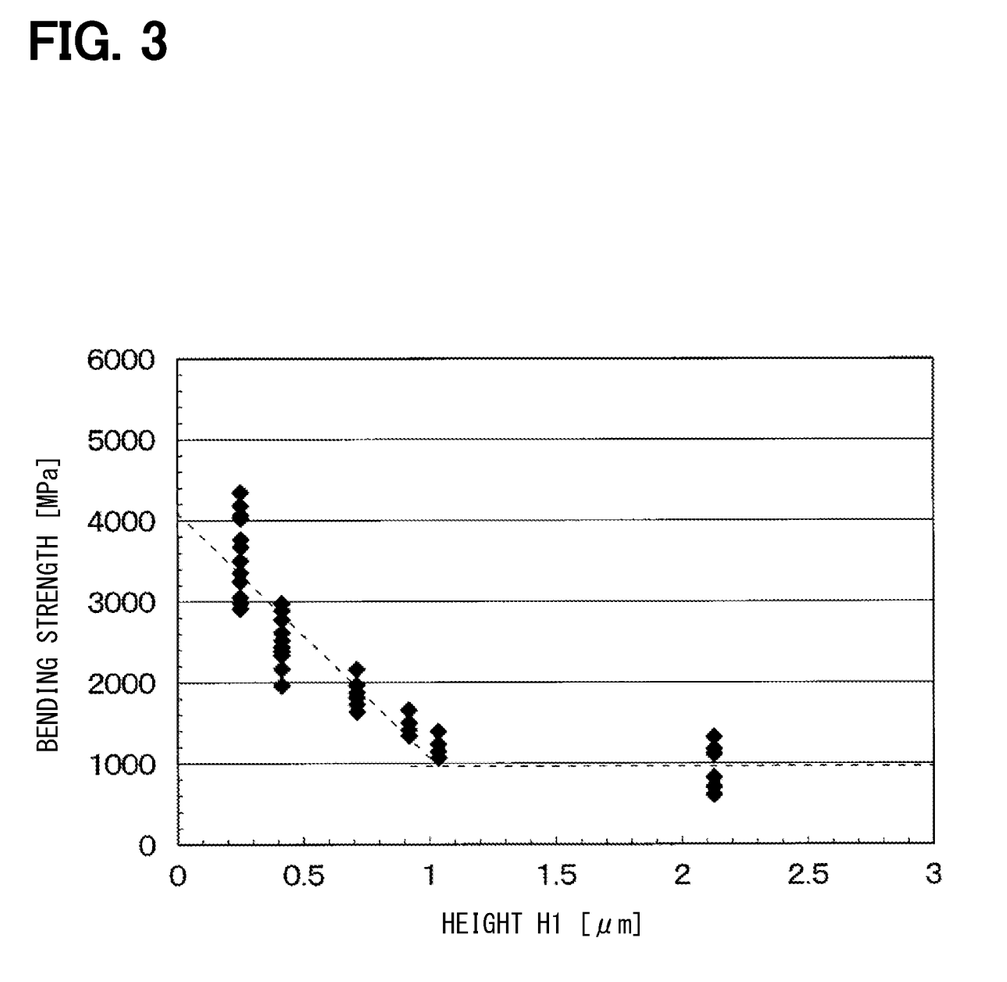
FIG. 3 is a diagram showing the relationship between the unevenness height H1 and the bending strength.

When the relationship between the unevenness height H1 and the bending strength is examined by an experiment, it is confirmed that, as the unevenness height H1 becomes higher, the bending strength decreases, as shown in FIG. 3. When the bending strength of a plurality of samples are plotted for each unevenness height H1 and the average values thereof are connected by a line, an approximate line indicated by a broken line in FIG. 3 is obtained. The bending strength capable of ensuring the element strength is 1000 MPa or more, and it is desirable that the bending strength becomes 1000 MPa or more in all manufactured products. According to the experiment, in order to satisfy a condition that the bending strength is equal to or higher than 1000 MPa in all the products, it is confirmed that the uneven height of H1≤1.0 μm is necessary. For this reason, in the present embodiment, the height H1 of the irregularities is set to be 1.0 μm or less.

In this way, by setting the uneven height of H1≤1.0 μm, the bending strength is set to be 1000 MPa or more. Therefore, it is possible to obtain a SiC semiconductor device that can suppress the decrease in element strength and improve reliability.

Next, a method for manufacturing the vertical power MOSFET shown in FIG. 1 will be described. Hereinafter, a method for forming the drain electrode 11 will be mainly described since a fundamental manufacturing method of the vertical type power MOSFET according to the present embodiment may be similar to a conceivable method.

The vertical power MOSFET according to the present embodiment is manufactured through each manufacturing process shown in FIGS. 4A to 4D.

Figure 4A:
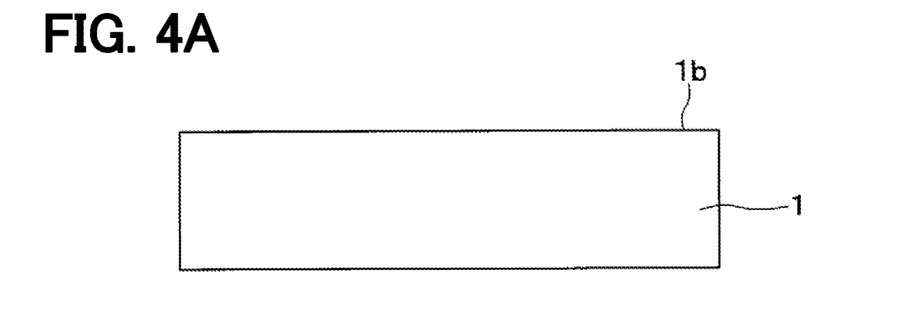
FIG. 4A is a cross-sectional view showing a step of forming a drain electrode in the SiC semiconductor device shown in FIG. 1.

As shown in FIG. 4A, an n+ type SiC substrate 1 having a thickness of 350 μm, for example, is provided. The n+ type SiC substrate 1 is manufactured by, for example, slicing an SiC ingot doped with an n type impurity and then polishing. Although not illustrated, a device forming step of forming at least a part of components of the semiconductor element on the front surface side of the n+ type SiC substrate 1 is performed. That is, after the n− type epitaxial layer 2 is epitaxially grown, the p− type base regions 3a and 3b, the deep base layers 30a and 30b, the n+ type source regions 4a and 4b are formed by ion implantation steps using unillustrated mask. Further, by forming the gate insulation film 7, the gate electrode 8, the insulation film 9, the source electrode 10, and the like, each component of the vertical power MOSFET as a device structure is formed.

Thereafter, although not illustrated, a part of a rear surface 1b portion of the n+ type SiC substrate 1 is removed by grinding and polishing to thin the n+ type SiC substrate 1. For example, the rear surface 1b of the n+ type SiC substrate 1 is directed to the upside, and an opposite surface is attached to a glass substrate. Thereafter, by performing CMP (Chemical Mechanical Polishing) or the like, a part of the rear surface 1b portion of the n+ type SiC substrate 1 is removed. At this time, the surface roughness Ra of the back surface 1b after the thinning process is set to be 5 nm or less. Then, by performing the steps shown in FIGS. 4B to 4D, the drain electrode 11 is formed on the rear surface 1b of the thinned n+ type SiC substrate 1.

Figure 4B:
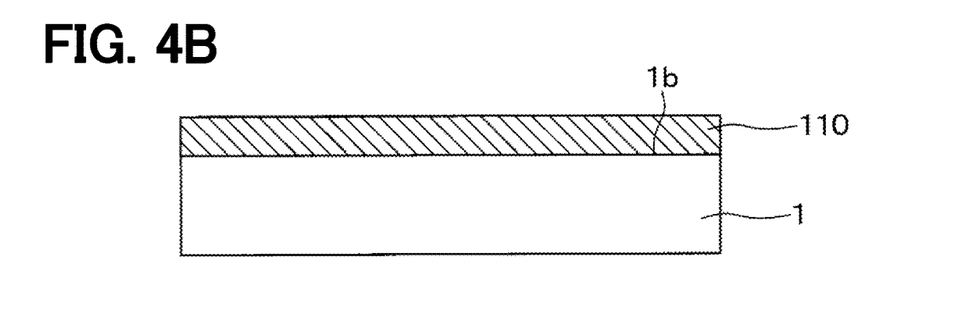
FIG. 4B is a cross-sectional view showing the step of forming the drain electrode, which is subsequent to FIG. 4A.

Specifically, as a step shown in FIG. 4B, a metal thin film 110 is formed on the back surface 1b of the n+ type SiC substrate 1 after thinning. As the metal thin film 110, a Ni layer is used. After the rear surface 1b of the n+ type SiC substrate 1 is treated and activated, the Ni layer is formed by electroless plating. The thickness of the metal thin film 110 is, for example, 50 nm to 250 nm.

In order to form a carbide with SiC, the Ni layer may be formed after forming a Mo layer on the rear surface 1b. When forming the Mo layer, the content of Ni is preferably more than Mo in molar ratio. For example, the molar ratio of Ni to Mo may be 1:1 to 2:1. Further, it is not limited to the stacking structure of the Mo layer and the Ni layer, and may be a mixed metal of Ni and Mo.

Figure 4C:
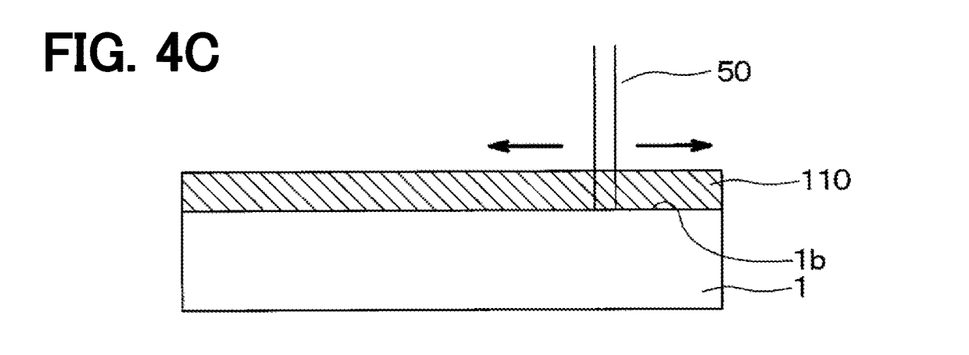
FIG. 4C is a sectional view showing a step of forming a drain electrode, which is subsequent to FIG. 4B.

Next, as shown in FIG. 4C, the laser annealing is performed by irradiating the metal thin film 110 with laser light 50. For example, the n+ type SiC substrate 1 on which the metal thin film 110 is formed is scanned on a X-Y plane using a solid state laser such as an LD pumped solid state laser, and the laser light 50 is irradiated on the rear surface 1b of the n+ type SiC substrate 1. More specifically, the top-hat beam shaping element and the condenser lens are arranged at the irradiation port of the solid-state laser so that the top-hat type laser is irradiated to the metal thin film 110. At this time, for example, a solid laser having a fundamental wavelength of 1064 nm is used, and the laser light is converted into a light having a wavelength of 355 nm, which is a third harmonic wave, or 266 nm, which is a fourth harmonic wave, by a wavelength conversion adapter, so as to prepare the laser light 50. With this wavelength, the laser light 50 does not pass through the SiC. Further, the energy density of the laser light 50 is set to 2.5 to 3.0 J/cm2, the spot diameter is 100 μm, and the overlap ratio at the time of spot irradiation, that is, the ratio of the overlapping length with respect to the diameter of continuous spots when the laser light 50 is scanned, 50% to 80%.

In this way, by performing local annealing such as laser annealing, the drain electrode 11 can be ohmically connected by a low temperature process that can suppress temperature rising of the region not irradiated with the laser. Therefore, it is possible to suppress the influence on the device formed on the front surface 1a of the n+ type SiC substrate 1. Note that the low temperature process referred to here is a process under a temperature at which thermal damage to the device can be suppressed. Specifically, a temperature at which aluminum (Al), which is generally used as a wiring material of the device, does not melt in the process may be considered. More specifically, a temperature equal to or less than 400 degrees Celsius (° C.) may be considered.

By performing such laser annealing, when the metal thin film 110 includes a metal element such as Ni that is to be silicidized, the metal element and Si included in the n+ type SiC substrate 1 react to each other by a silicidation reaction, so that metal silicide is synthesized. When the metal thin film 110 includes Ni, Ni silicide is synthesized. When the metal thin film 110 includes a metal element to be carbided such as Mo, the metal element reacts with C included in the n+ type SiC substrate 1 to form metal carbide. When the metal thin film 110 includes Mo, Mo carbide is formed. When the metal thin film 110 is made of Mo/Ni, the drain electrode 11 is configured such that NiSi 11a and MoC 11b are scattered as shown in FIG. 2. Then, by performing such laser annealing, unevenness is formed by the scattered drain electrodes 11.

At this time, since the laser annealing is performed by the top-hat type laser, the uneven height H1 of the drain electrode 11 can be reduced, and the uneven height of H1≤1.0 µm can be achieved.

Figure 5A:
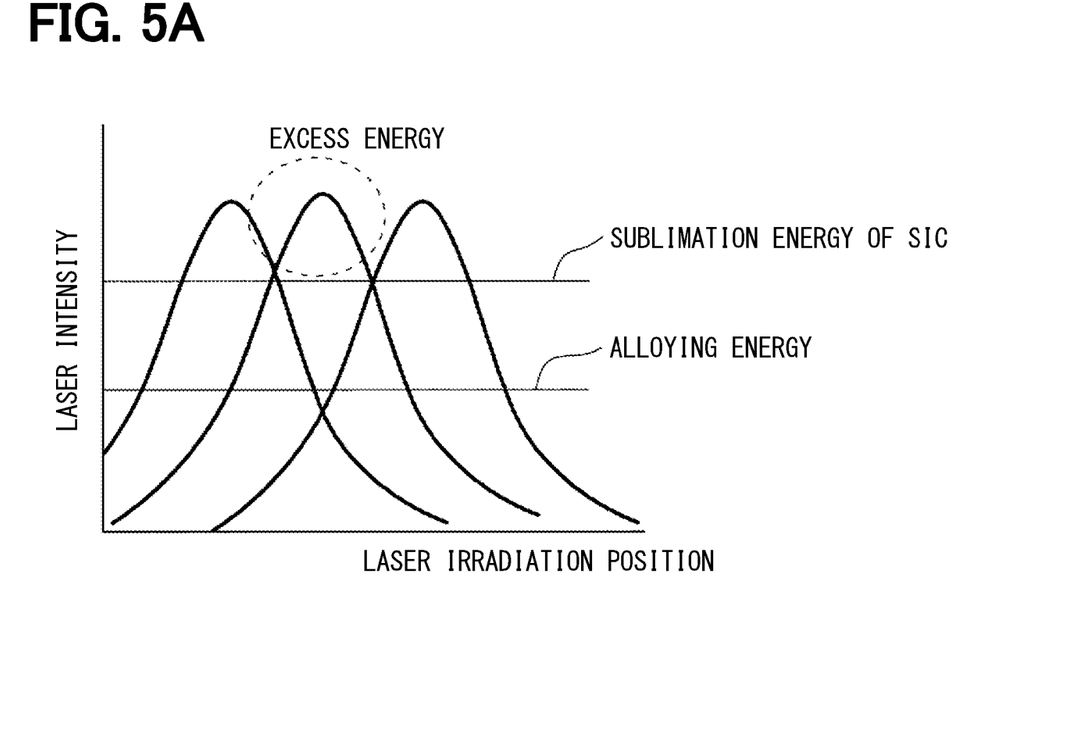
FIG. 5A is a diagram showing a laser intensity when a Gaussian beam is used as a reference example.
Figure 6A:
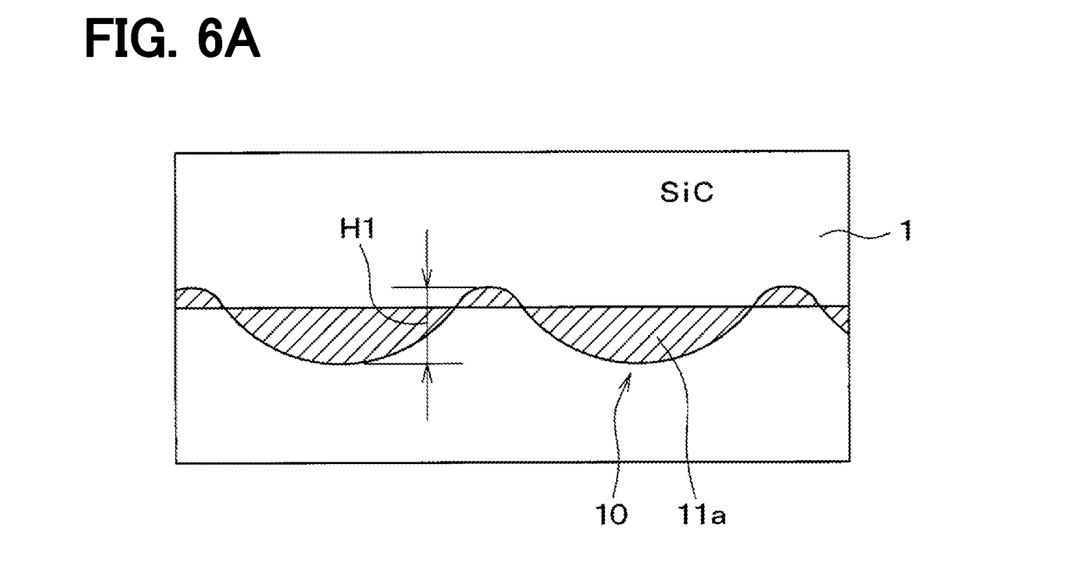
FIG. 6A is a cross-sectional view showing a state of an interface between SiC and a drain electrode when a Gaussian beam is used as a reference example.

For example, a Gaussian beam is used in a conceivable laser annealing. Therefore, as shown in FIG. 5A, the laser intensity of the energy originally required for alloying should be obtained, but the energy becomes equal to or higher than the energy for sublimation of SiC, and the SiC surface sublimes as shown in FIG. 6 so that the surface has a large unevenness. Therefore, the unevenness height H1 of the drain electrode from the SiC surface is increased due to the effect of the unevenness of the SiC surface, and is about 2.1 µm, for example.

Figure 5B:
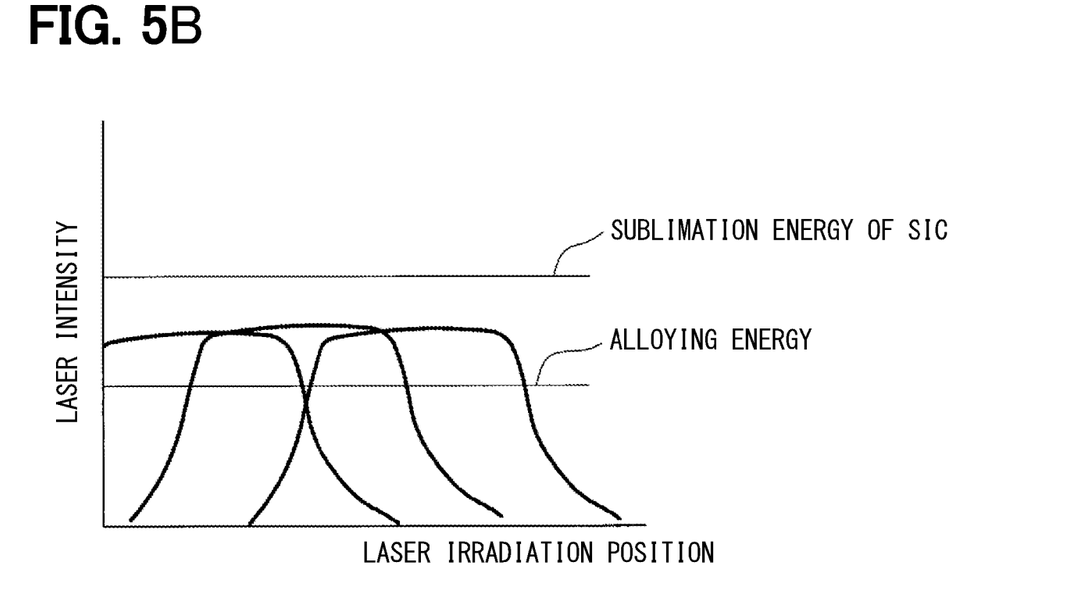
FIG. 5B is a diagram showing laser intensity when the top-hat type laser described in the present embodiment is used.
Figure 6B:
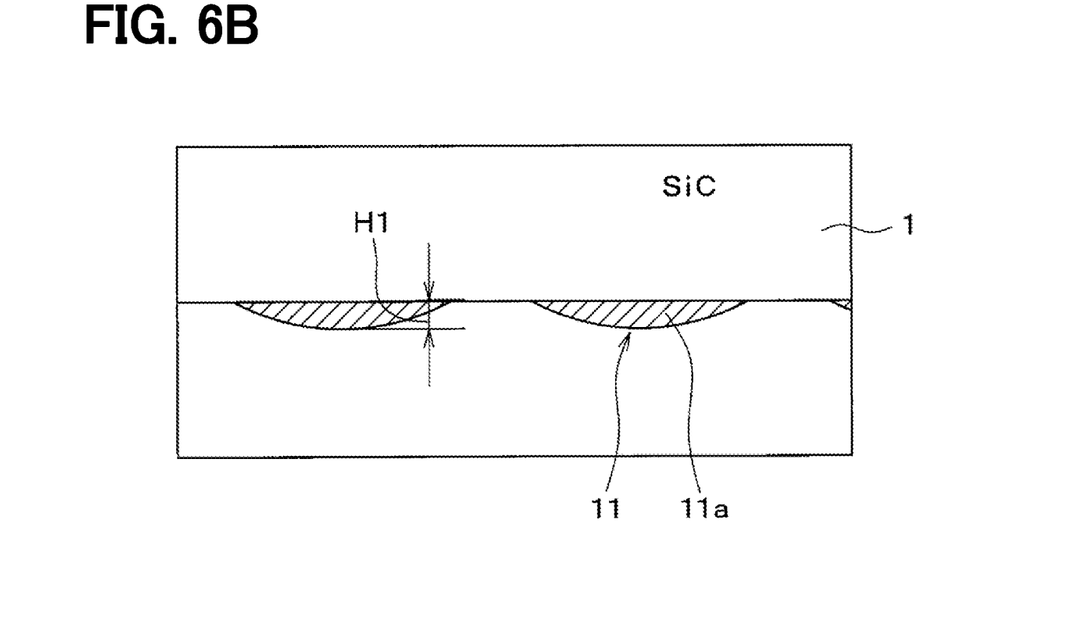
FIG. 6B is a cross-sectional view showing the state of the interface between the SiC and the drain electrode when the top-hat type laser described in this embodiment is used.

On the other hand, in the case of the present embodiment, laser annealing is performed by a top hat type laser. Therefore, as shown in FIG. 5B, it is possible to obtain the laser intensity of the energy required for alloying and make the laser intensity smaller than the energy for sublimation of SiC by flattening a peak intensity. As a result, as shown in FIG. 6B, the sublimation of the SiC surface is suppressed and the unevenness can be reduced. Therefore, the SiC surface becomes substantially flat, and the height H1 of the unevenness of the drain electrode 11 from the interface between the back surface 1b of the n$^+$ type SiC substrate 1 and the drain electrode 11 can be set to H1≤1.0 µm.

Figure 4D:
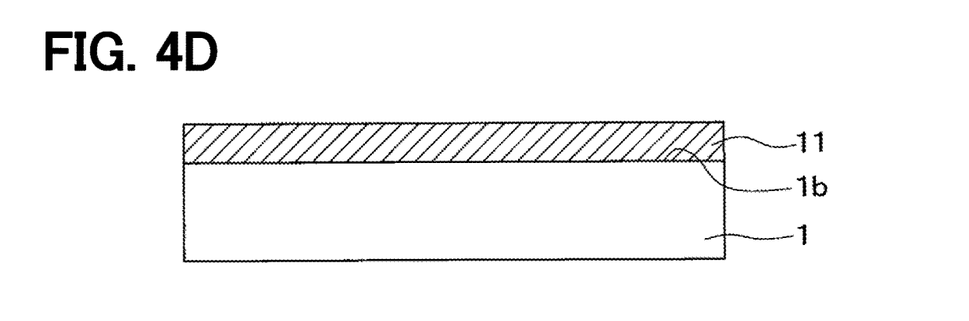
FIG. 4D is a cross-sectional view showing the step of forming the drain electrode, which is subsequent to FIG. 4C.

In this way, the drain electrode 11 as shown in FIG. 4D is formed. After that, although not shown, the bonding electrode 12 can be formed by sequentially stacking Ti that becomes a barrier metal, eutectic material Ni at the time of soldering, Au that becomes an oxidation protection agent, and the like. Then, a dicing tape is attached to the drain electrode 11 and peeled off from the glass substrate. Thereafter, dicing is performed to divide it into chip units, thereby completing the SiC semiconductor device.

Therefore, in the present embodiment, the unevenness height H1 of the drain electrode 11 from the surface of the back surface 1b of the n$^+$ type SiC substrate 1, that is, the interface between the back surface 1b and the drain electrode 11 is less than 1.0 µm. Therefore, the bending strength is 1000 MPa or more, and it is possible to suppress the decrease in the element strength and to provide a SiC semiconductor device with improved reliability.

In the present embodiment, since the laser annealing is performed by the top-hat type laser, the laser intensity at the time of laser annealing is suppressed from being equal to or higher than the energy for sublimation of SiC, and the unevenness of the SiC surface is minimized. Therefore, the SiC surface becomes substantially flat, and the height H1 of the unevenness of the drain electrode 11 from the interface between the back surface 1b of the n$^+$ type SiC substrate 1 and the drain electrode 11 can be set to H1≤1.0 µm. Therefore, it is possible to manufacture a SiC semiconductor device having a bending strength of 1000 MPa or more.

In particular, as in the present embodiment, the surface roughness Ra of the back surface 1b after the thinning step is set to be 5 nm or less. Therefore, even after the laser annealing, the surface roughness of back surface 1b is small, and it is possible to suppress the height H1 of unevenness of drain electrode 11 from the SiC surface due to the effect of unevenness of back surface 1b.

Other Embodiments

Although the present disclosure is made with reference to the embodiments described above, the present disclosure is not limited to such embodiments but may include various changes and modifications which are within equivalent ranges. In addition, various combinations and forms, and further, other combinations and forms including only one element, or more or less than these elements are also within the spirit and the scope of the present disclosure.

(1) For example, in the first embodiment, the ohmic electrode is described to be formed on the rear surface of the SiC substrate of the device having components on the front surface. Alternatively, the structure described in the first embodiment may not be disposed only to the rear surface of the SiC substrate of the device having components on the front surface. The structure may be disposed to any part as far as forming ohmic electrode on SiC. For example, the structure may be applied to a case where an ohmic electrode is formed on the front surface of the SiC substrate. Also in this case, when forming the ohmic electrode after forming the components of the device, laser annealing is performed. As a result, local heating can be performed to suppress the influence for the device. In the above embodiment, the case where Ni is used as the electrode metal or the case where Mo is used in addition to Ni are described, alternatively, other materials may be used.

(2) In the first embodiment, the solid laser is used as an example of the laser annealing. Alternatively, the laser annealing may not be limited to the solid laser, and, for example, an excimer laser or the like may be used.

(3) Further, when the ohmic electrode for SiC is formed by laser annealing as described in the first embodiment, the alignment may not be recognized by the alignment mark only having the irregularities formed on the normal SiC surface due to the laser trace. For example, in a chip tester that is carried out during transportation, an alignment mark is recognized using a stereoscopic microscope or a camera in order to confirm the direction when dicing into chips. At this time, since SiC is used as the substrate material, the light is transmitted through the SiC and reflected on the back surface, so that it is difficult to distinguish the laser mark from the alignment mark.

Therefore, when forming an ohmic electrode by laser annealing, it is preferable to form an alignment mark made of metal (hereinafter referred to as a metal alignment mark). In particular, it is preferable to use a metal mark in a diode in which it is difficult to confirm the orientation of the chip due to the shape of the electrode on the front surface side.

Figure 7A:
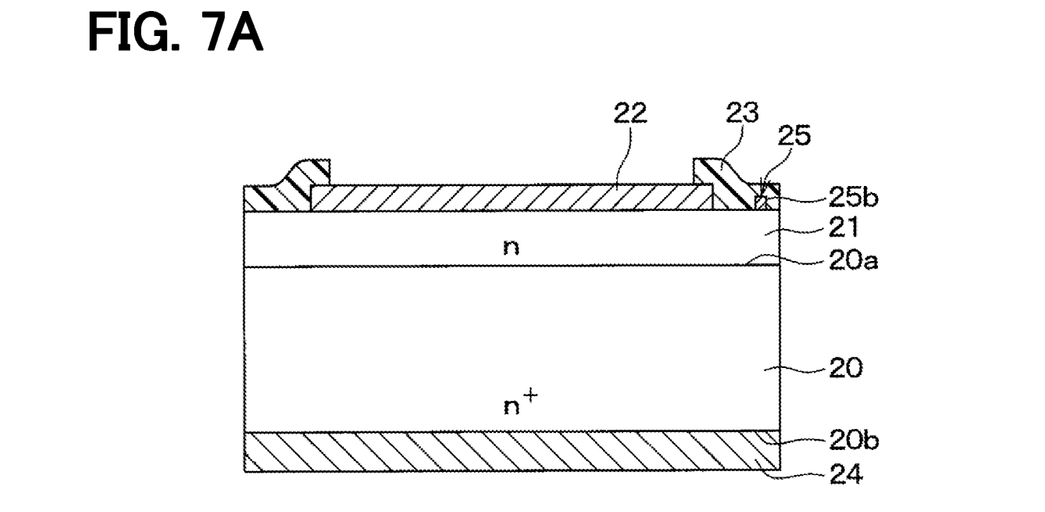
FIG. 7A is a cross-sectional view of a Schottky diode described in another embodiment.

For example, in the case of a Schottky diode, as shown in FIG. 7A, the n type layer 21 made of SiC is formed on the surface 20a of the n$^+$ type SiC substrate 20. Then, the Schottky electrode 22 is formed thereon, and the protection film 23 is formed so as to cover the periphery of the Schottky electrode 22 and the surface of the n type layer 21. Further, the ohmic electrode 24 is formed on the back surface 20b of the n$^+$ type SiC substrate 20. In the Schottky diode having such a structure, as shown in FIG. 7B, since the Schottky electrode 22 is formed in a square shape or the like, it is difficult to confirm the chip orientation with the shape of the Schottky electrode 22.

Figure 7B:
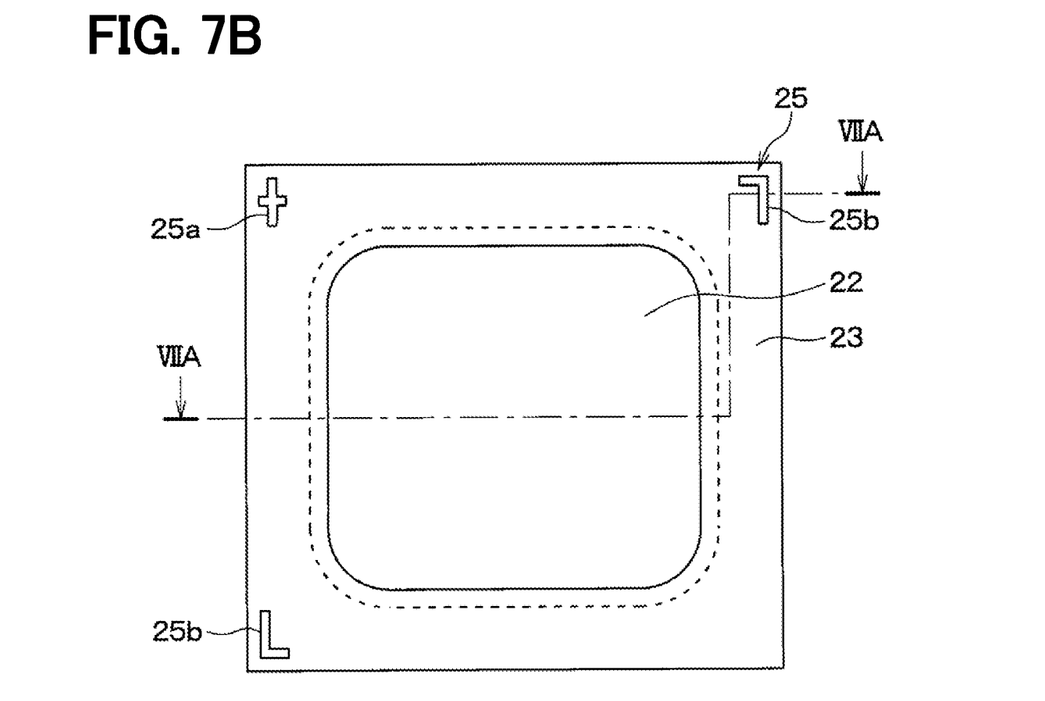
FIG. 7B is a top view of the Schottky diode shown in FIG. 7A.

In this case, for example, as shown in FIGS. 7A and 7B, the metal mark 25 may be provided so as to be covered with the protection film 23 at a position apart from the Schottky electrode 22. When the metal mark 25 is provided at such a position, since it is covered with the protection film 23, a function as an alignment mark can be exhibited without generating a creeping discharge with the Schottky electrode 22.

Although the shape of the metal mark 25 may be any shape, as shown in FIG. 7B, it may be a cross shaped mark 25a, an L-shaped mark 25b, or the like. Here, the cross shaped mark 25a is arranged in one of the four corners, and the L-shaped mark 25b is arranged in two adjacent corners. Alternatively, it may not be always necessary, and only one mark may be arranged as long as the orientation of the chip is confirmed. For example, in the case of the cross shaped mark 25a, when the lengths of the intersecting lines are different from each other, the orientation of the chip can be confirmed by only one mark. Also in the case of the L-shaped mark 25b, when the length of each line extending from the bent portion is different from each other, the direction of the chip can be confirmed by only one mark.

(4) In the first embodiment, the SiC semiconductor device including the vertical power MOSFET as the semiconductor element has been described as an example. Alternatively, this configuration is merely an example, and other semiconductor element such as a diode and an IGBT may be included. That is, any SiC semiconductor device may be used as far as having an ohmic electrode for a semiconductor element formed on a SiC semiconductor substrate.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A silicon carbide semiconductor device comprising:
    a silicon carbide semiconductor substrate that has a front surface and a rear surface; and
    a plurality of ohmic electrodes that are in ohmic contact with a surface of silicon carbide on at least one of the front surface and the rear surface of the silicon carbide semiconductor substrate, wherein:
    the plurality of ohmic electrodes are scattered on the surface of the silicon carbide to provide a concavity and convexity;
    the concavity and convexity have a height due to the ohmic electrodes of less than 1.0 µm;
    the ohmic electrodes include NiSi and MoC disposed inside of the NiSi; and
    the NiSi and the MoC are scattered to provide the concavity and convexity.

2. A method for manufacturing a silicon carbide semiconductor device, the silicon carbide semiconductor device including:
    a silicon carbide semiconductor substrate that has a front surface and a rear surface; and
    a plurality of ohmic electrodes that are in ohmic contact with a surface of silicon carbide on at least one of the front surface and the rear surface of the silicon carbide semiconductor substrate,
    the plurality of ohmic electrodes being scattered on the surface of the silicon carbide to provide a concavity and convexity;
    the concavity and convexity having a height due to the ohmic electrodes of less than 1.0 µM;
    the ohmic electrodes including NiSi and MoC disposed inside of the NiSi; and
    the NiSi and the MoC being scattered to provide the concavity and convexity, the method comprising:
    forming a metal thin film made of a metal material for forming at least one of silicide and carbide on the silicon carbide to be in ohmic contact with the ohmic electrodes; and
    forming the ohmic electrodes by performing a laser anneal with irradiating a laser beam on the metal thin film to react the metal thin film and Si or C in the silicon carbide and to form the at least one of metal silicide and metal carbide, wherein:
    the laser anneal is performed by a top-hat type laser.

3. The method for manufacturing the silicon carbide semiconductor device according to claim 2, further comprising:
    thinning the silicon carbide semiconductor substrate by removing the surface of the silicon carbide semiconductor substrate on which the ohmic electrodes are formed before the forming of the metal thin film, wherein:
    the surface of the silicon carbide semiconductor substrate after the thinning has a surface roughness equal to or smaller than 5 nm.

4. The method for manufacturing the silicon carbide semiconductor device according to claim 2, wherein:
    the metal material for forming the metal thin film includes at least one of Ni, Mo, Ti, W, Nb, and Ta; and
    in the forming of the metal thin film, the metal thin film has a thickness in a range between 50 nm and 250 nm.

5. The method for manufacturing the silicon carbide semiconductor device according to claim 2, wherein:
    in the performing of the laser anneal to form the ohmic electrode, the laser beam has an energy density in a range between 2.5 J/cm$^2$ and to 3.0 J/cm$^2$, the laser beam is irradiated by a spot irradiation, and an overlapping ratio of an overlapping length with respect to a diameter of a spot is in a range between 50% and 80%.

6. The silicon carbide semiconductor device according to claim 1, further comprising
    a metal bonding electrode, a layer of which covers each of the plurality of ohmic electrodes including NiSi and MoC disposed inside of the NiSi.

7. The silicon carbide semiconductor device according to claim 6, wherein:
    the layer covering each of the plurality of ohmic electrodes contacts the surface of the silicon carbide between ohmic electrodes.

8. The silicon carbide semiconductor device according to claim 7, wherein:
    the metal bonding electrode is made of one or more of Ti, Ni, and Au, and
    the layer covering each of the plurality of ohmic electrodes is made of Ti.

9. The silicon carbide semiconductor device according to claim 1, wherein:
    each ohmic electrode including the NiSi and the MoC inside the NiSi is provided as a single particle;
    a plurality of particles made of the NiSi and the MoC are scattered on the surface of the silicon carbide semiconductor substrate; and
    the plurality of particles provide the concavity and convexity.

10. The silicon carbide semiconductor device according to claim 9, further comprising
    a metal bonding electrode, a layer of which covers each of the plurality of scattered particles made of NiSi and the MoC.

11. The silicon carbide semiconductor device according to claim 10, wherein:

the layer covering each of the plurality of scattered particles contacts the surface of the silicon carbide between the scattered particles made of NiSi and the MoC.

12. The method for manufacturing the silicon carbide semiconductor device according to claim 2, wherein:
the silicon carbide semiconductor device further includes a metal bonding electrode, a layer of which covers each of the plurality of ohmic electrodes including NiSi and MoC disposed inside of the NiSi.

13. The method for manufacturing the silicon carbide semiconductor device according to claim 12, wherein:
the layer covering each of the plurality of ohmic electrodes contacts the surface of the silicon carbide between ohmic electrodes.

14. The method for manufacturing the silicon carbide semiconductor device according to claim 13, wherein:
the metal bonding electrode is made of one or more of Ti, Ni, and Au, and
the layer covering each of the plurality of ohmic electrodes is made of Ti.

15. The method for manufacturing the silicon carbide semiconductor device according to claim 2, wherein:
each ohmic electrode including the NiSi and the MoC inside the NiSi is provided as a single particle;
a plurality of particles made of the NiSi and the MoC are scattered on the surface of the silicon carbide semiconductor substrate; and
the plurality of particles provide the concavity and convexity.

16. The method for manufacturing the silicon carbide semiconductor device according to claim 2, wherein:
the silicon carbide semiconductor device further includes a metal bonding electrode, a layer of which covers each of the plurality of scattered particles made of NiSi and the MoC.

17. The silicon carbide semiconductor device according to claim 16, wherein:
the layer covering each of the plurality of scattered particles contacts the surface of the silicon carbide between the scattered particles made of NiSi and the MoC.

* * * * *